United States Patent [19]
Miyake et al.

[11] Patent Number: 5,898,910
[45] Date of Patent: Apr. 27, 1999

[54] RBDS RECEIVER PROVIDED WITH A DATABASE HAVING BROADCASTING STATION RELATED INFORMATION

[75] Inventors: Takashi Miyake; Shinichi Abe, both of Kawagoe, Japan

[73] Assignee: Pioneer Electronic Corporation, Tokyo, Japan

[21] Appl. No.: 08/598,866

[22] Filed: Feb. 9, 1996

[30] Foreign Application Priority Data

Feb. 16, 1995 [JP] Japan .................................. P7-028363

[51] Int. Cl.$^6$ ...................................................... H04B 1/16
[52] U.S. Cl. ...................................... 455/186.1; 455/161.2
[58] Field of Search .................................. 455/45, 161.1, 455/161.2, 185.1, 186.1, 186.2

[56] References Cited

U.S. PATENT DOCUMENTS

| | | | |
|---|---|---|---|
| 5,276,909 | 1/1994 | Milner et al. .............................. | 455/45 |
| 5,303,401 | 4/1994 | Duckeck et al. ...................... | 455/186.1 |
| 5,345,607 | 9/1994 | Liman et al. ......................... | 455/186.1 |
| 5,393,713 | 2/1995 | Schwob ................................ | 455/186.1 |
| 5,471,662 | 11/1995 | Shiota ................................. | 455/186.1 |
| 5,475,874 | 12/1995 | Klos .................................... | 455/161.2 |
| 5,483,684 | 1/1996 | Ono et al. ............................ | 455/161.2 |
| 5,548,828 | 8/1996 | Kozaki et al. ........................ | 455/161.2 |

FOREIGN PATENT DOCUMENTS 1-117529  5/1989  Japan .

OTHER PUBLICATIONS

United States RBDS Standard For Broadcast Data Systems, Draft No. 1.4 NRSC Document, Jan. 10, 1992.

*Primary Examiner*—Dwayne D. Bost
*Assistant Examiner*—William G. Trost
*Attorney, Agent, or Firm*—Finnegan, Henderson, Farabow, Garrett & Dunner, L.L.P.

[57] ABSTRACT

This RBDS receiver comprises a database having broadcasting station related information. The receiver is provided with a read-only database memory in which broadcasting station related data have been stored respectively in association with geographical positional information, the broadcasting station related data including broadcasting station identification data, program type identification data and receptiond frequency data; a demodulator system for demodulating the RBDS data from received broadcast waves; a randomly accessible database supplementary memory; and a control system for comparing the RBDS data with the broadcasting station related data and the data stored in the supplementary memory to perform write control for writing the RBDS data into the supplementary memory if a broadcasting station indicated by the RBDS data is not coincident with any of broadcasting stations indicated by the broadcasting station related data and the data stored in the supplementary memory. According to the present invention, the database can be supplemented immediately and accurately in response to updates and revisions of the contents of actually broadcast programs. Also, the control for display and so on can be appropriately performed in accordance with the contents of actually broadcast programs.

9 Claims, 15 Drawing Sheets

- ● CITY
- ○ TRANSMISSION STATION REGISTERED IN DATABASE
- ◌ TRANSMISSION STATION NOT REGISTERED IN DATABASE
- △ RECEIVER

FIG.3

DATABASE MEMORY TABLE

| GRID | CALL SIGN (PI) | FORMAT (PTY) | RECEPTION FREQUENCY | | | CITY | STATE |
|---|---|---|---|---|---|---|---|
| $g_1$ | ST11 | JAZZ | fA | | | — | |
| $g_2$ | ST21 | NEWS | fB | | | — | |
| $g_3$ | — | — | — | | | — | S1 (IOWA) |
| $g_4$ | ST41 | CLASSIC | fC | | | — | |
| $g_5$ | ST51 | NEWS | fD | | | C11 | |
| | ST52 | POPS | fE | | | | |
| ⋮ | ⋮ | ⋮ | ⋮ | | | ⋮ | |
| $g_6$ | ST61 | ROCK | fF | | | — | |
| $g_7$ | ST71 | ROCK | fG | | | — | S2 (ILLINOIS) |
| | ST72 | NEWS | fH | | | | |
| | ST73 | TALK | fI | | | | |
| $g_8$ | ST81 | JAZZ | fJ | | | — | |
| | ST82 | POPS | fK | | | | |
| $g_9$ | — | — | | | | C23 | |

FIG. 4

DATABASE SUPPLEMENTARY MEMORY TABLE

| RECEPTION FREQUENCY | PI (CALL SIGN) | PTY (FORMAT) | GRID |
|---|---|---|---|
| $f_1$ | ST12 | CLASSIC | $g_5$ |
| $f_2$ | ST31 | COUNTRY | $g_5$ |
| $f_3$ | ST53 | NEWS | $g_5$ |
| $f_4$ | ST91 | SPORT | $g_5$ |
| $f_1$ | ST12 | CLASSIC | $g_3$ |
| $f_2$ | ST31 | COUNTRY | $g_3$ |
| $f_3$ | ST53 | NEWS | $g_3$ |
| $f_D$ | ST51 | POPS | $g_7$ |
| $f_n$ | ST725 | ROCK | $g_{72}$ |

△ RECEIVER

FIG. 8

PTY NETWORK MEMORY TABLE

| # 1 | | # 2 | | # n | |
|---|---|---|---|---|---|
| ROCK | | POPS | | NEWS | |
| F 1 | R | F 7 | | F 9 | R |
| F 2 | | F 8 | | F 10 | |
| F 3 | | | | F 4 | R |
| F 4 | R | | | | |
| F 5 | | | | | |
| F 6 | | | | | |

— PTY NETWORK MEMORY ACCESS PROCESSING (2) —

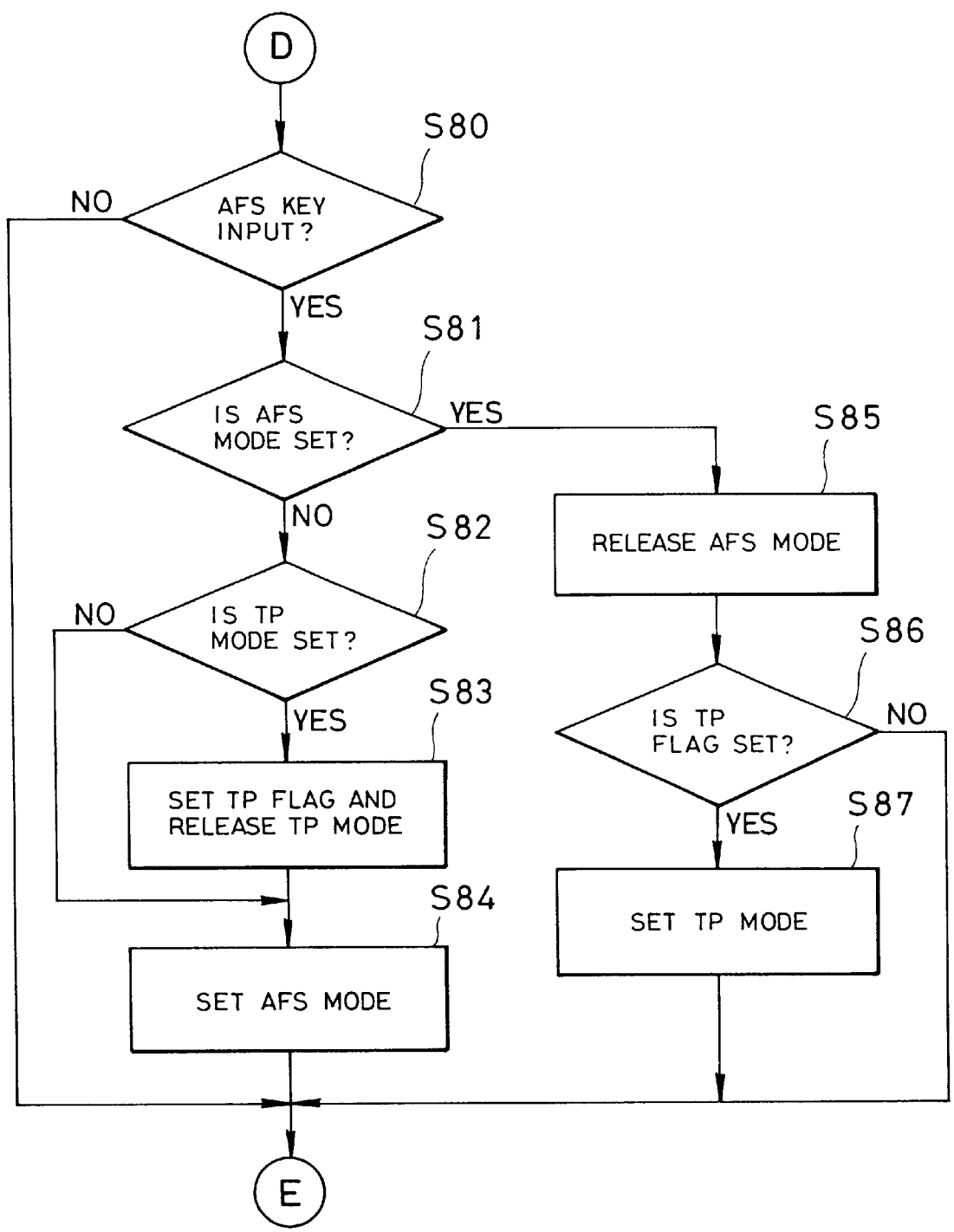

RBDS RECEIVER PROVIDED WITH A DATABASE HAVING BROADCASTING STATION RELATED INFORMATION

BACKGROUND OF THE INVENTION

1. Field of the Invention

The present invention relates to a receiver for receiving broadcast waves, and more particularly to a receiver, which is provided with a database having broadcasting station related information for identifying broadcasting stations, the type of broadcast programs and so on, for receiving RBDS (Radio Broadcasting Data System) broadcast waves in which a main information signal such as an audio signal and an information data signal related to a broadcasting station transmitting the main information signal are multiplexed.

2. Description of the Related Art

The RBDS in the United States is similar to the RDS (Radio Data System) practically used in Europe. Specifically, on the transmitter side, additional control signals such as a PI (Program Identification) code for identifying a broadcasting station, a PTY (Program Type) code for identifying or classifying a broadcast program, and so on are frequency-division-multiplexed on an audio signal constituting a main information signal to generate transmission waves (broadcast waves). Then, on the receiver side, these codes are read from received broadcast waves, so that a variety of controls can be carried out in accordance with the contents of the read codes. Other than such receivers relying upon the RBDS broadcast waves, there is also a database type receiver which has a previously prepared database including identification data for identifying broadcasting stations, the type of broadcast programs, and so on, respectively expected to be received. In detail the identification data is stored in a non-volatile memory such as a ROM (Read-Only Memory) as the broadcasting station related information in association with reception frequencies and reception areas (for example, individual areas defined by dividing the entire territory of the United States at intervals of 0.5 degrees both on the latitude and on the longitude. The divided area is called "grid") to form the database. In the database type receiver, the memory is accessed, upon actually receiving broadcast waves, to read out information indicative of a grid corresponding to a reception position of the receiver, broadcasting station corresponding to a preset reception frequency and the type of a received broadcast program. On the basis of the read information, displaying is performed with respect to the name of the broadcasting station (for example, a call sign) and the type of the received broadcast program (for example, a rock program, a jazz program, a news program and so on. The information indicative of the program type is called "format"). The receiver furthermore performs to select a broadcasting station emitting a type of a broadcast program desired by a user. Such a type of receiver is described, for example, in Laid-open Japanese Patent Application No. 1-117529(1989).

In recent years, there have been further proposed a database type RBDS receiver which utilizes dedicated update data available from RBDS broadcast waves. According to this receiver, the stored data of a database memory is supplemented such that broadcasting station related information can be acquired in accordance with an actual receiving condition or receiving environment. More specifically, supplementary broadcasting station related information supplied from update data is stored into a database supplementary memory such as a RAM provided in the receiver separately from the database memory, such that a variety of proper controls are carried out using integrated data information including supplementary data stored in the supplementary memory and original data stored in the database memory. This proposal has been made, for example, in "UNITED STATES RBDS STANDARD FOR BROADCAST DATA SYSTEMS, DRAFT NO. 1.4 NRSC DOCUMENT, Jan. 10, 1992," and particularly, "3.1.3.6 Type 5 groups: Transparent data channels" from page 22 in the document treats the above-mentioned configuration.

In the receiver which supplements the database using the update data as mentioned above, the database supplementary memory is controlled for writing data only when RBDS broadcast waves having update data are received by the receiver. However, it can be thought that the update data is emitted from an associated broadcasting station later than the time the contents of broadcast programs are actually updated, in which case, the receiver is forced to use an old version of broadcasting station related information for control, so that the receiver is obliged to perform improper control not adapted to the recent broadcast contents.

OBJECTS AND SUMMARY OF THE INVENTION

The present invention has been made in view of the problem mentioned above, and its object is to provide an RBDS receiver which is capable of immediately and accurately responding to updates or revisions of actual broadcast contents to supplement a database without delay.

It is one of the other objects of the present invention to provide an RBDS receiver which is capable of performing proper control for display and so on in accordance with the contents of actually broadcast programs.

An RBDS receiver according to a first aspect of the present invention is provided with a database having broadcasting station related information. The receiver comprises a read-only database memory in which a broadcasting station related data have been previously stored respectively in association with geographical positional information. The related data has at least three kinds of data including a station identification data for identifying a broadcasting station, a program identification data for indicating the type of a program provided by the broadcasting station, and a reception frequency data on broadcast waves emitted from the broadcasting station. The receiver further comprises demodulating means for demodulating an RBDS data from received broadcast waves; a randomly accessible database supplementary memory; and control means for comparing the contents of the RBDS data with the contents of the broadcasting station related data and the data stored in the supplementary memory and for controlling the writing of the RBDS data into the supplementary memory if a broadcasting station indicated by the RBDS data is not coincident with any of broadcasting stations indicated by the broadcasting station related data and the data stored in the supplementary data.

An RBDS receiver according to a second aspect of the present invention is provided with a database having broadcasting station related information which has at least three kinds of data including a station identification data for identifying a broadcasting station, a program identification data for indicating the type of a program provided by the broadcasting station, and a reception frequency data on broadcast waves emitted from the broadcasting station. The receiver comprises a read-only database memory in which the broadcasting station related data has been stored respectively corresponded to geographical positional information;

demodulating means for demodulating an RBDS data from received broadcast waves; and station selection memory for storing identification data for identifying a single program type and at least one reception frequency data of broadcast waves providing the program type for each station selection key information. In the station selection memory, an RBDS ID data is stored for each of reception frequency data stored in the station selection memory, RBDS identification data indicating whether or not broadcast waves received by the use of associated reception frequency data are RBDS broadcast waves.

An RBDS receiver according to a third aspect of the present invention is provided with a database having broadcasting station related information. The receiver has a read-only database memory in which a broadcasting station related data is stored respectively corresponded to geographical positional information. The related data has at least three kinds of data including a station identification data for identifying a broadcasting station, a program identification data for indicating the type of a program provided by the broadcasting station, and a reception frequency data on broadcast waves emitted from the broadcasting station; and demodulating means for demodulating an RBDS data from received broadcast waves, wherein a traffic information receiving mode is prohibited from being set simultaneously with a set program receiving mode. The traffic information receiving mode is a mode for preferentially receiving RBDS broadcast waves providing traffic information by using a traffic information program identification data included in RBDS data. The set program receiving mode is a mode for preferentially receiving broadcast waves of a set program type based on program data identification data included in the RBDS data and/or the stored data included in the database memory.

According to the RBDS receiver of the first aspect, the contents of the RBDS data are compared with the contents of the broadcasting station related data and the data stored in the supplementary memory such that the RBDS data is written into the supplementary memory if a broadcasting station indicated by the RBDS data is not coincident with any of broadcasting stations indicated by the broadcasting station related data and the data stored in the supplementary data.

According to the RBDS receiver of the second aspect, in a station selection memory for storing identification data indicating a program type and at least one reception frequency data for broadcast waves providing the program type, RBDS identification data indicating whether or not broadcast waves received based on the reception frequency data are RBDS broadcast waves is stored for each of reception frequency data stored therein.

According to the RBDS receiver of the third aspect, the traffic information receiving mode for preferentially receiving RBDS broadcast waves providing traffic information based on traffic information program identification data included in RBDS data is prohibited from being set simultaneously with the set program receiving mode for preferentially receiving broadcast waves of a set program type based on RBDS data and/or identification data on the program type included in the data stored in the database memory.

BRIEF DESCRIPTION OF THE DRAWINGS

FIG. 3 is a memory map table showing a corresponding relationship between respective data stored in a database memory in the RBDS receiver illustrated in FIG. 1;

FIG. 4 is a memory map table showing a corresponding relationship between respective data stored in a database supplementary memory in the RBDS receiver illustrated in FIG. 1;

FIG. 8 is a memory table showing a corresponding relationship between respective data stored in a PTY network memory (station selection memory) in the RBDS receiver of FIG. 1 corresponding to station selection key information;

FIG. 15 is a flow chart representing the latter half of the TP mode and AFS mode setting processing executed by the control circuit in RBDS receiver of FIG. 1.

DETAILED DESCRIPTION OF THE EMBODIMENTS

The present invention will hereinafter be described in detail with reference the accompanying drawings.

Figure 1:
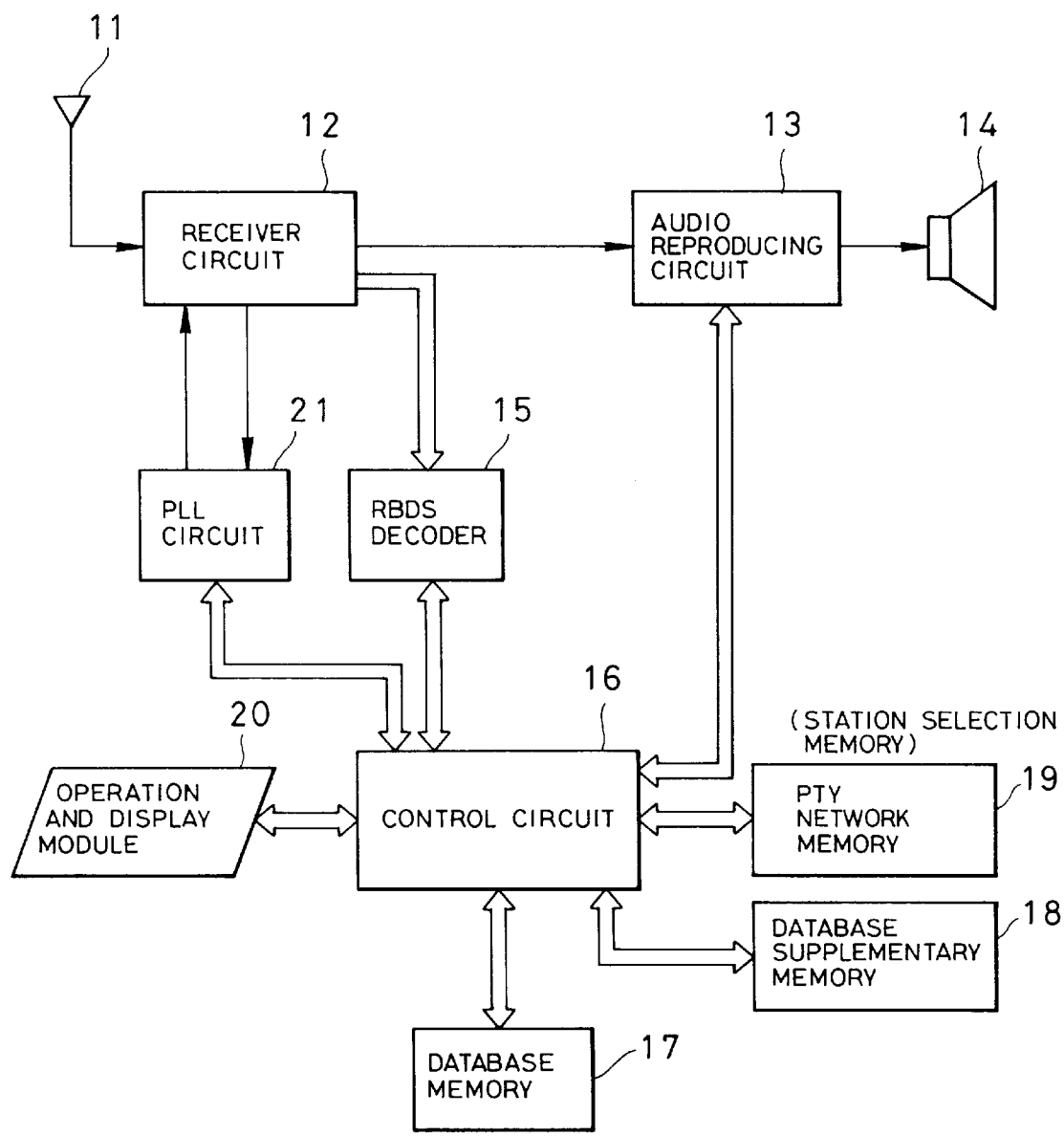
FIG. 1 is a block diagram illustrating a basic configuration of an RBDS receiver according to one embodiment of the present invention.

FIG. 1 illustrates a basic configuration of an RBDS receiver according to one embodiment of the present invention.

Referring specifically to FIG. 1, an antenna 11 is provided as radio waves receiving antenna for capturing RBDS broadcast waves having multiplexed an audio signal and an RBDS data signal as well as non-RBDS broadcast waves including no RBDS data signal, and supplies to a receiver circuit 12 functioning as a tuner with received waves as a received signal. The receiver circuit 12 includes a high frequency amplifier circuit and a frequency converter circuit which constitute a front end. The receiver circuit 12 is tuned to a received signal at a reception frequency set by a frequency control signal supplied thereto, outputs an audio signal reproduced by amplifying and detecting of the received signal, and extracts an RBDS data signal from a detected signal. The output audio signal of the receiver circuit 12 is supplied to an audio reproducing circuit 13. The audio reproducing circuit 13 subjects to predetermined signal processing such as low frequency amplification, and then generates a driving signal for a speaker 14. The data signal from the receiver circuit 12 is supplied to a decoder 15 which decodes of the data signal in accordance with RBDS. This decoding process is performed based on control signals from a control circuit 16, and the processed data is transferred to the control circuit 16. The control circuit 16 is also responsible for controlling access to a memory 17 consisting of non-volatile memory devices such as ROM serving as a database having broadcasting station related information for identifying broadcasting stations, the type of broadcast programs, and so on, as mentioned above.

Figure 2A:
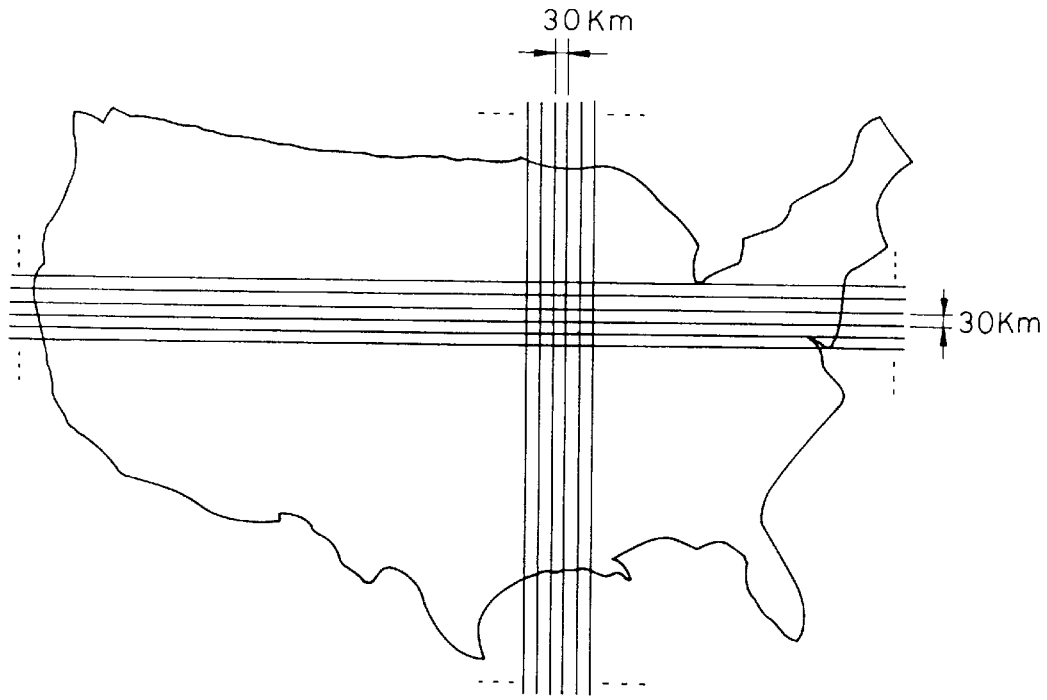
FIGS. 2A and 2B are schematic diagrams showing the relationship of respective broadcasting station related data stored in a database memory with geographical information in the RBDS receiver illustrated in FIG. 1.
Figure 2B:
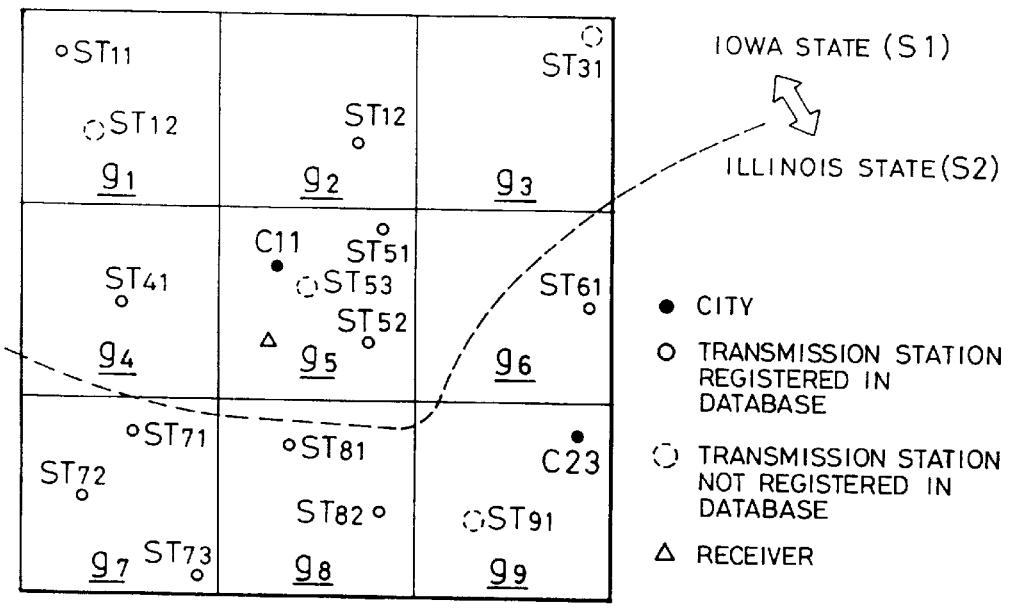

In a database format employed in the memory 17, detailed information on all broadcasting stations transmitting broadcast waves possibly received by the receiver is stored in relation to information for identifying the positions of the respective broadcasting stations (in other words, broadcast wave emitted sites which include the positions of radio wave emitting towers). While a variety of implementations may be available to the storage of the information,. FIGS. 2A, 2B and 3 show an example of how the detailed information is stored. It should be noted that the database described in the aforementioned laid-open patent application may also be applied to the memory 17.

FIG. 2A is a schematic map illustrating the territory of the United States, and FIG. 2B is an enlarged view of a portion in the map of FIG. 2A. These maps show that the entire territory of the United States is divided into square areas having a side of a predetermined length, for example, 40 Km (the area is hereinafter called "grid area"), and the grid areas are respectively managed as geographical data. The data of each of these grid areas is encoded so as to lead to the position of a transmission station and the position of a receiver on the map. For example, referring to an enlarged view of grid areas g1–g9, it is known, at the time the data is written into ROM, that eleven transmission stations ST11–ST82 exist in these nine grid areas. Thus, in the database memory 17, identification information for each of transmission stations existing in each grid area can be stored in relation to a call sign code of the station for each grid area identifying code (grid code), as shown in a memory table of FIG. 3. In this way, if the receiver is positioned in a grid area g5, the existence of transmission stations ST51 and ST52 in the area including the receiver can be found by referring to the data stored in the database memory 17.

The database memory 17 stores, in addition to the call sign code for identifying a broadcasting station, a format code of a program provided by the broadcasting station and a reception frequency code of broadcast waves emitted from the broadcasting station, in association with the call sign code. The format herein called is such one that is used in a so-called in-receiver database system, which identifies the attribute, type, kind or nature of respective programs. For example, the format may designate a talk program, a classic music program, or the like, as shown in FIG. 3. In another aspect, the "format" corresponds to "PTY" in RBDS. The database memory 17 further stores a code for identifying a city and a code for identifying a state for facilitating a search of each code (particularly, the grid code). For example, these codes are stored in such a manner that the grid areas g1–g5 belong to Iowa State (S1), and the grid areas g6–g9 belong to Illinois State (S2), and the grid area g5 corresponds to a city C11, and a grid area g9 corresponds to a city C23.

It should be noted that while in this example, the code for identifying a broadcasting station is determined by the "call sign", this is equivalent to the "PI" code in RBDS.

Turning back to FIG. 1, the control circuit 16 also determines whether information carried by a data signal in RBDS broadcast waves on air should be fetched into the receiver, in comparison with information already stored or contained in the database memory 17. If determining that the information should be fetched, the control circuit 16 also performs access control including write control for transferring output data of the decoder 15 to a memory 18 composed of randomly accessible memory devices, for example, such as RAM. This database supplementary memory 18 may be implemented, for example, in accordance with a storage format shown in FIG. 4. In FIG. 4, the reception frequency code, PI code, PTY code, and grid code are corresponded to one another. Among these codes, the PI code serves to identify a broadcasting station similarly to the call sign code stored in the database memory 17, and the PTY code serves to classify programs similarly to the format code. Also, the grid code stored in the database supplementary memory 18 identifies a position at which each code is received, i.e., a grid area which includes a position at which RBDS broadcast waves having each code are received.

The control circuit 16 further controls an access to a memory 19 in which PTY codes and reception frequencies are stored in a mutual relation with each other in association with a number indicative of key information previously set in correspondence to key operations for selecting a broadcasting station on an operation and display module 20 (hereinafter, the key information is called the preset station selection information). A storage format in the PTY network memory 19 and the access control thereto will be described later in greater detail.

The operation and display module 20 performs a variety of instruction operations such as an operation for specifying preset station selection key information for a broadcasting station to be received, and displays operating states of the receiver, including a display of information related to received broadcast waves (the name of a broadcasting station or call sign, the type of the program, and so on). These operation and display are performed together with the control circuit 16.

A PLL (Phase Locked Loop) circuit 21 supplies the receiver circuit 12 with a frequency control signal in accordance with a station selection data from the control circuit 16 so as to set a tuning frequency (reception frequency) corresponding to the selection data. More specifically, the receiver circuit 12 has a VCO (Voltage Controlled Oscillator) for frequency conversion, such that the phase of a VCO output signal is compared with the phase of a signal based on the station selection data from the control circuit 16 in the PLL circuit 21. The PLL circuit 21 then controls an oscillating frequency of the VCO in the receiver circuit 12 by a control signal corresponding to the comparison result, i.e., a phase difference between these signals.

Next, the processing executed by the control circuit 16, which is the characteristic operations of the receiver according to the present invention, will be described below.

I. RBDS Data Fetch and Display Processing in Response to a Setting of a Reception Frequency This processing will be described with reference to a flow chart of FIG. 5.

Figure 5:
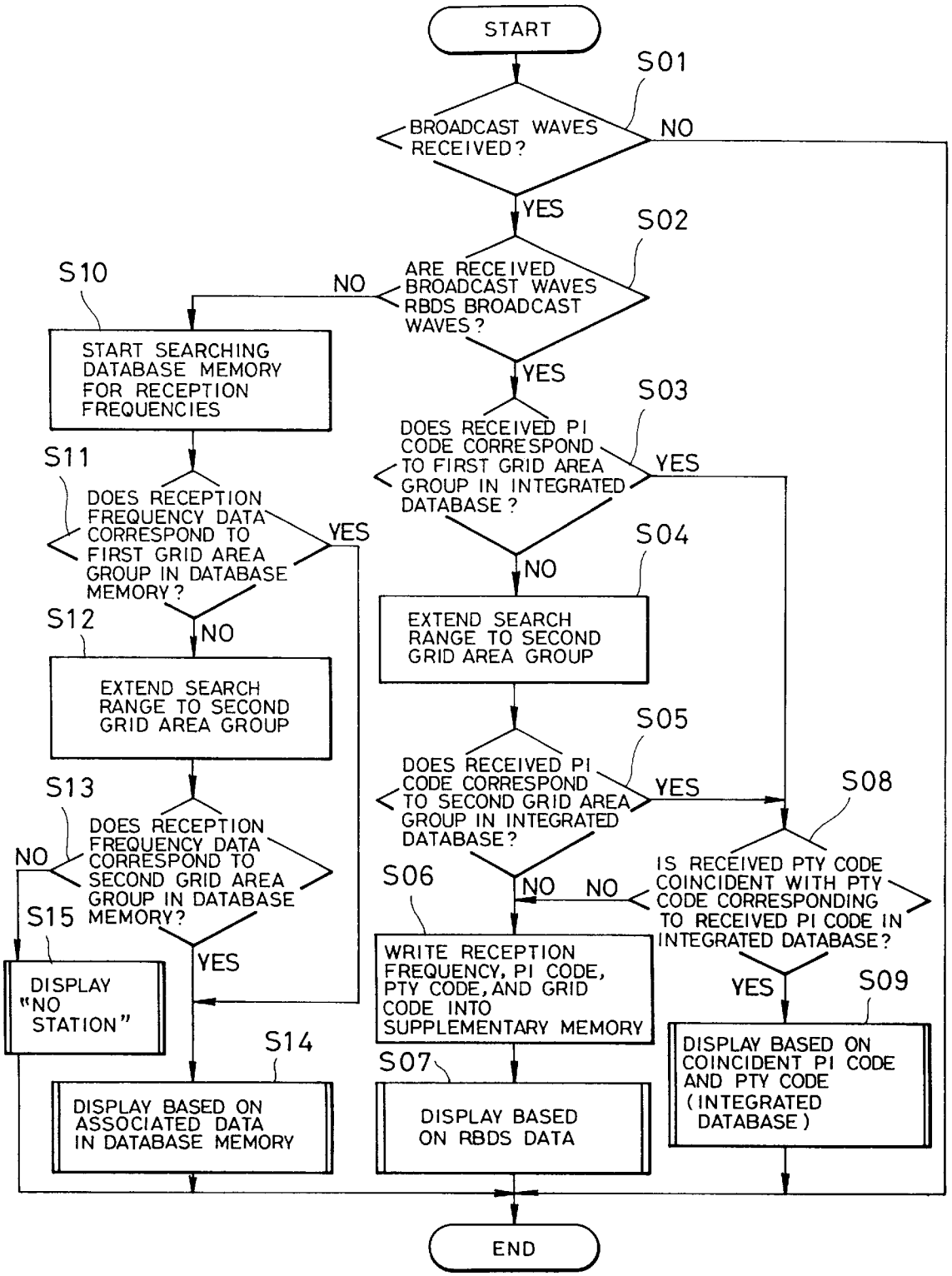
FIG. 5 is a flow chart representing an RBDS data fetch and display processing executed in response to a setting of a reception frequency by a control circuit in the RBDS receiver illustrated in FIG. 1.

Referring specifically to FIG. 5, the control circuit 16, when a new reception frequency is set through the operation and display module 20, sets the reception frequency in the receiver circuit 12 through the PLL circuit 21. Then, the processing represented by the flow chart of FIG. 5 is entered. First, it is determined whether or not broadcast waves are received at the set reception frequency (step S01). The broadcast waves herein used refer to transmission waves emitted from a broadcasting station. Thus, determined at step S01 is whether or not the received waves are broadcast waves based, for example, on an intermediate frequency signal level produced in the receiver circuit 12. If no broadcast waves can be received, the processing of the flow chart is terminated.

If determined at step S01 that broadcast waves can be received, it is next determined whether or not the received broadcast waves are RBDS broadcast waves (step S02). This determination may be made, for example, by checking a lock state of a PLL circuit, not shown, in the decoder 15. In addition, a determination as to whether RBDS data is multiplexed on received broadcast waves basically accomplishes the processing in step S02.

If RBDS broadcast waves can be confirmed at step S02, it is determined whether or not a PI code in RBDS data from the decoder 15 is included in stored data corresponding to a first grid area group in the database memory 17 and the memory 18 for supplementing the database memory 17 (hereinafter, data stored in these two memories are collectively called "integrated database") (step S03). Employed as the first grid area group is a single grid area including the current position or a plurality of grid areas made up of the grid area including the current position and grid areas therearound. For example, in FIG. 2, since the receiver is positioned in the grid area g5, when the number of areas in the first grid area is set to nine, a group of 3×3 grid areas including the grid area g5, i.e., a group of the grid area g5 and grid areas g1–g3, g4, g6–g9 surrounding the grid area g5, corresponds to the first grid area group, as illustrated in the enlarged view of FIG. 2B. If determining at step S03 that the received PI code does not exist in stored data in the integrated database corresponding to the first grid area group, a search range is extended (step S04), and the received PI code is again searched in the extended range (step S05). More specifically, it is determined whether or not the PI code in the RBDS data from the decoder 15 exists in stored data corresponding to a second grid area group in the integrated database. The second grid area group refers to a geographical region surrounding the first grid area group, and has a relationship with the first grid area group, for example, as illustrated in FIG. 6.

Figure 6:
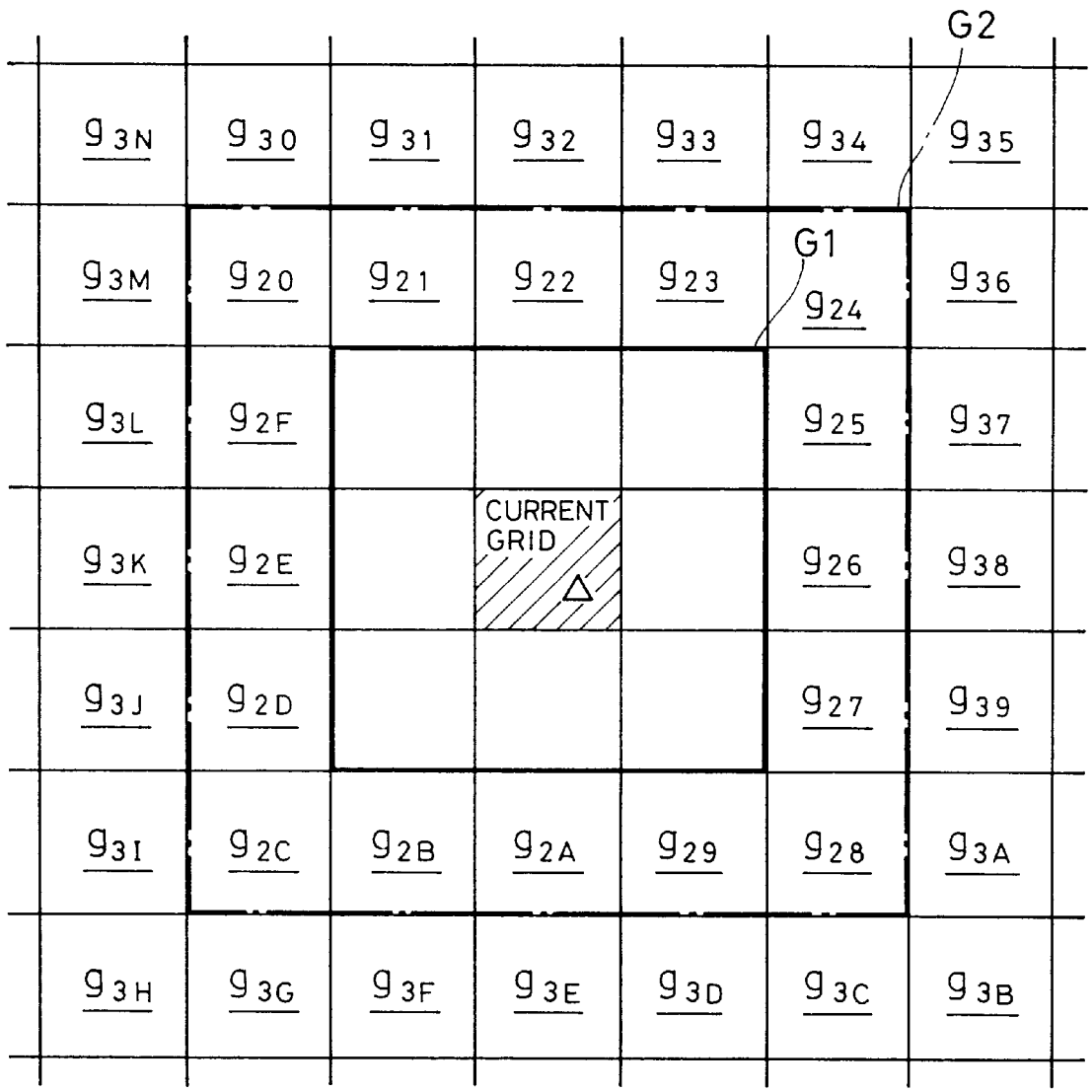
FIG. 6 is a schematic diagram showing a relationship between a first grid area group and a second grid area group.

Referring now to FIG. 6, each area defined by the grid lines shows a grid area. The second grid area group G2 consists of 16 grid areas g20–g2F surrounding the first grid area group G1. Thus, at step S05, the search is made for the received PI code with respect to data corresponding to the 16 grid areas except for the respective grid areas belonging to the first grid area group G1, so that at the end of this step, all of 5×5 grid areas around the grid area including the current receiver position have been searched for the received PI code. Alternatively, the second grid area group may be set to include grid areas g30–g3N, as illustrated in FIG. 6.

At steps S03 and S05 in this flow chart, it is determined whether data related to a broadcasting station emitting received broadcast waves exists in the database memory 17 using the PI code as it is, on the assumption that the PI code is stored in the database memory 17 as information for identifying broadcasting stations. However, if the call sign data only is stored in the database memory 17 as the information for identifying broadcasting stations without using the PI code, the received PI code may be converted to the call sign data so as to compare the converted call sign data with the call sign data stored in the database memory 17. For executing the processing at steps S03 and S05, the control circuit 16 performs read-out control for the memory 17, 18, and comparison control to determine whether the data read by these steps (PI code or call sign data) and the received PI code lead to (or indicate) the same broadcasting station. The current position (receiver position) relied on for deciding grid areas included in the first grid area group may be detected by a measuring system or a current position supply system, not shown. For this detection, a method disclosed, for example, in Laid-open Japanese Patent Application 2-238724 (1990) or the like may be employed. Alternatively, the current position can also be detected using the mutual relationship among data as shown in FIG. 3 by the user inputting the name of a state or a city through the operation and display module 20 to find the current position in a corresponding grid. The two-step comparison control is performed at steps S03 and S05 in order to reduce the time required to search the integrated database for the received PI code as much as possible. For this purpose, first at step S03, a limited few number of grid areas around the current position, in which the reception of broadcast waves is most likely, are searched, and then, a sufficiently large area is searched at step S05 to cover substantially all possible areas, only if the determination result at step S03 shows that the broadcasting station information corresponding to received PI code is not found in the integrated database. In this way, it is quite probable that the received PI code is found only by the execution of step S3 without the additional execution of step S05, thus contributing to reduction in search time. Of course, it will be understood that such two-step search of the received PI code is not essential, and a one-step search may be performed instead, or a larger number of search steps may also be provided. Anyway, any search method may be employed as long as the existence of the received PI code can be eventually detected in the integrated database in a reliable manner.

If the existence of the received PI code is not finally detected in the integrated database at step S05, the control circuit 16 determines that the received RBDS broadcast waves are emitted from a new broadcasting station or a broadcasting station which has not been registered in the database, and writes into the memory 18 necessary data of the output RBDS data from the decoder 15 including data on the set reception frequency, PI code, PTY code, and so on, together with the grid code corresponding to the current position which is now being set or recognized (step S06). For example, if received RBDS broadcast waves are received at a current position corresponding to the grid code g5 from a transmission station ST31 not registered in the database, as illustrated in FIG. 2, information related to the transmission station ST31 is stored into the memory 18 in correspondence with the grid code g5 including the current position as shown in FIG. 4. It should be noted that the relationship between the grid code and broadcasting station related information stored in the memory 18 is different from the relationship between a grid area and a broadcasting station positioned in the grid area, as stored in the database memory 17. The relationship in the memory 18 indicates that each grid area is related to receivable broadcast programs (or broadcast stations, or broadcast waves) in the grid area. Thus, if RBDS broadcast waves are received from a transmission station ST12, ST53 or ST91, not registered in the database, with the current position corresponding to the grid code g5, information related to each of these nonregistered transmission stations is stored in correspondence to the grid area g5. Likewise, if RBDS broadcast waves are received from a transmission station ST12, ST31, ST53, not registered in the database, with the current position corresponding to the grid code g3, information related to each of these nonregistered transmission stations is stored in correspondence to the grid area g3. FIG. 4 also represents this relationship. Subsequent to step S06, and therefore in synchronism with step S06, a call sign is displayed with reference to the PI code, and a program type is displayed with reference to the PTY code, for example, based on the RBDS data (step S07), followed by the termination of the processing of this flow chart.

If determined at step S03 or S05 that broadcasting station related information associated with the received PI code exists in the integrated database, the PTY or format codes (hereinafter, collectively called the PTY code for explanation) corresponding to the received PI code within all data stored in the integrated database are sequentially compared with a PTY code (hereinafter called the received PTY code) included in the output RBDS data from the decoder 15(step S08). If the received PTY code is coincident with a PTY code corresponding to the received PI code in the integrated database, the name of the broadcasting station and the program type are displayed based on the PTY code and the PI code (step S09), followed by the termination of the processing of this flow chart. If the received PTY code is not coincident with any of PTY codes corresponding to the received PI code in the stored data in the integrated database, the flow proceeds to step S06. Such discrepancy may occur when the program type of received broadcast waves dynamically changes to cause the received PTY code to differ from any PTY codes having corresponded in standard (collectively or representatively) to the received PI code in the integrated database, or when PTY codes which should be corresponded to the received PI code are basically mistake in the integrated database. In response, the control circuit 16 newly stores the PTY code derived from the RBDS data into the database supplementary memory 18 in correspondence to the received PI code. For example, if RBDS broadcast waves are received from a transmission station ST51 already registered in the database memory 17 in a current position within the grid code g7, and if the PTY code in the received broadcast waves does not indicate "NEWS" as illustrated in FIG. 3 but "POPS", information related to the transmission station ST51 is stored together with a PTY code indicative of "POPS" in correspondence to the grid code g7. FIG. 4 also represents this operation.

It a determination is made at step S02 that the received broadcast waves are not RBDS broadcast waves, the control circuit 16 starts searching the database memory 17 for the set reception frequency (step S10). Then, after starting the search, it is determined whether or not data on the set reception frequency exists in stored data corresponding to the first grid area group in the database memory 17 (step S11). If determined at step S11 that the reception frequency data does not exist in the database memory 17, a search range is extended (step S12), and further search is made for the reception frequency in the extended range (step S13). In other words, it is determined whether data on the current reception frequency exists in stored data corresponding to the second grid area group in the database memory 17. While the first and second grid areas herein called are similar to those used at steps S03–S05, different grid areas may be used instead.

If determined at step S11 or S13 that data on the current reception frequency exists in the database memory 17, a display is made in accordance with the PI code and the PTY code based on stored data corresponding to the reception frequency in the database memory 18 (step S14), followed by the termination of the processing of this flow chart. On the other hand, if finally determined at step S13 that data on the current reception frequency does not exist in the database memory 17, announcement, for example, "No STATION" is displayed for notifying that the station emitting the received broadcast waves is undefined or that the database memory 17 does not have information on the station emitting the broadcast waves having the reception frequency. Such announcement may be provided in the form of voice.

II. RBDS Data Fetch in Parallel with Sweep of Reception Frequency

This processing will be described with reference to a flow chart of FIG. 7.

Figure 7:
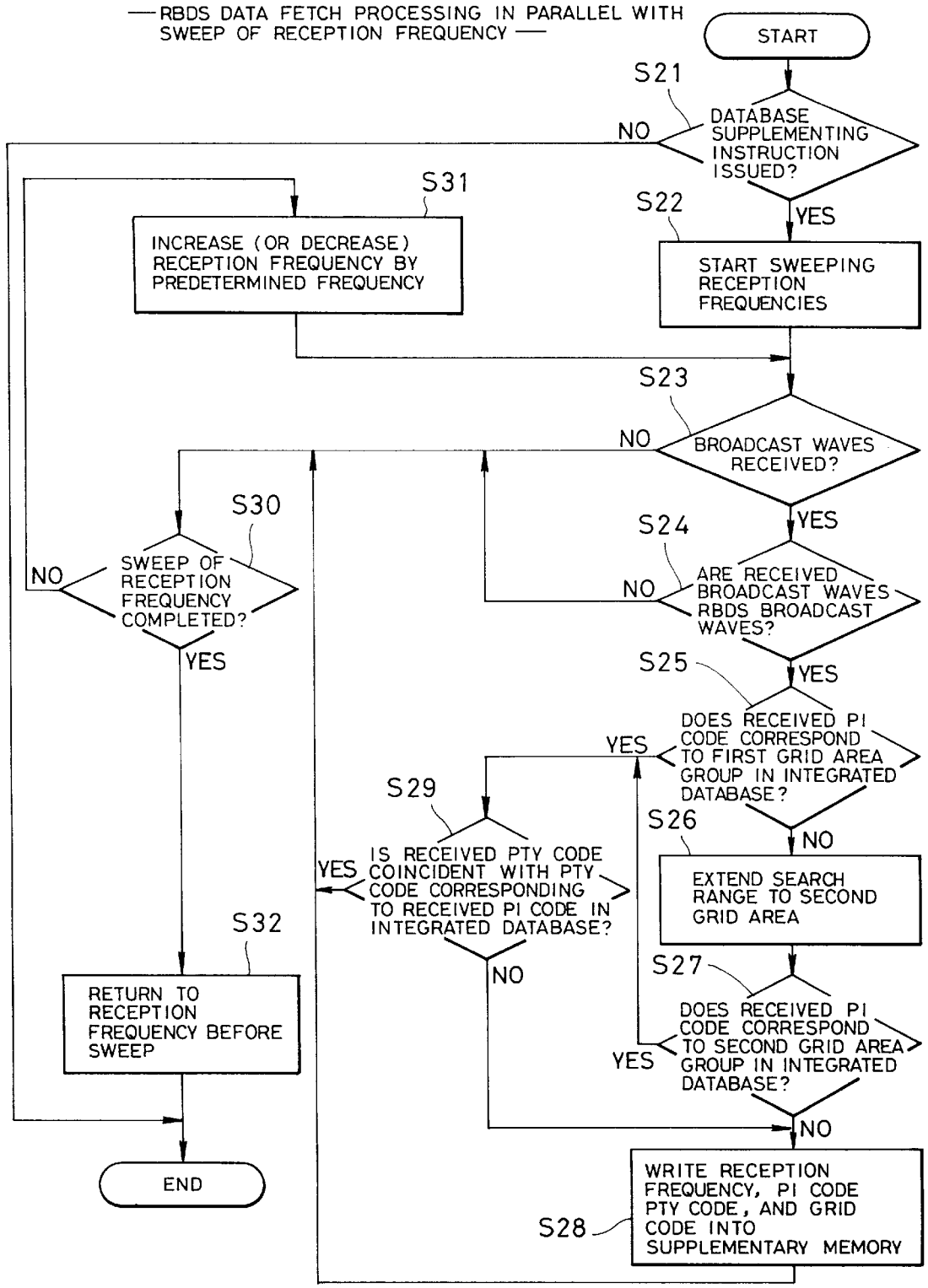
FIG. 7 is a flow chart representing an RBDS data fetch processing executed by the control circuit in the RBDS receiver illustrated in FIG. 1 in parallel with a sweep of tuning frequencies.

Referring specifically to FIG. 7, the control circuit 16 determines whether or not an instruction has been issued for performing control to supplement the database over the entire range of reception frequency settable in the receiver or receiver circuit 12 (step S21). The database supplementing instruction may be issued by the user through manipulations on the operation and display module 20, by the control circuit 16 when the receiver is powered off, or by the control circuit 16 when the receiver moves to cause a change in the grid area to which the receiving position belongs or which includes the receiving position (i.e., when the current grid area is changed). The change of the grid area may be made manually through the operation and display module 20 or automatically by the above-mentioned measuring system or the like.

When the database supplementing instruction is issued, the control circuit 16 forces the receiver circuit 12 to start sweeping reception frequency through the PLL circuit 21 (step S22). Then, similarly to step S01 in FIG. 5, it is determined whether or not broadcast waves are received at a reception frequency set at this time on the basis of an output signal from an audio reproducing circuit 13 (step S23). If determined at step S23 that broadcast waves are received, then it is determined whether or not the received broadcast waves are RBDS broadcast waves, in a manner similar to step S02 in FIG. 5 (step S24).

If RBDS broadcast waves are confirmed at step S24, it is determined whether or not a PI code included in RBDS data from the decoder 15 exists in stored data corresponding to the first grid area group in the integrated database (step S25). If determined at step S25 that the received PI code does not exist in the integrated database, the search range is extended as mentioned above (step S26), and the received PI code is again searched in the extended range (step S27). If the existence of the received PI code is not finally detected at step S27, necessary data (reception frequency data, PI code, PTY code and so on) included in output RBDS data from the decoder 15 are written into the memory 18 together with the grid code corresponding to the currently set or recognized position of the receiver, regarding that the received RBDS broadcast waves are emitted from a new broadcasting station or a broadcasting station which has not been registered in the integrated database (step S28).

If determined at step S25 or S27 that the received PI code exists in the integrated database, the received PTY code is sequentially compared with PTY codes included in the stored data corresponding to the received PI code in the integrated database (step S29). If the received PTY code is not coincident with any of the PTY codes stored in the integrated database corresponding to the received PI code at step S29, the flow proceeds to step S28.

If the received PTY code is coincident with a PTY code stored in the integrated database corresponding to the received PI code at step S29, the flow proceeds to step S30, determining that the RBDS data need not be written into the memory 18 since it has already been contained in the database. If determined at step S23 that no broadcast waves are received, or if at step S24 no RBDS broadcast waves are confirmed, or if at step S28 the writing into the database supplementary memory 18 has been completed, the flow also proceeds to step S30. At step S30, it is determined whether the receiver circuit 12 has completely the sweep of all settable reception frequency.

If determined at step S30 that the sweep of reception frequency has not been completed, the receiver circuit 12 is forced to increase (or decrease) the set reception frequency by a predetermined amount (step S31), and then the flow jumps back to step S23. Conversely, if determined at step S30 that the sweep of reception frequency has been completed, the reception frequency is again set to the value which has been set before starting the sweep, followed by the termination of this flow chart. If the database supplementing instruction for starting the processing of this flow chart is issued while the receiver is receiving at a certain reception frequency or when the current grid is being changed, the receiving operation is resumed at the reception frequency set again after the completion of the processing of this flow chart. Also, if the database supplementing instruction is issued while the receiver is powered off (in an apparatus having a receiver block and other source blocks integrated therewith, the receiver block is powered off), the receiver is turned off after the reception frequency thus set again or identification information corresponding thereto is stored into a predetermined memory as information on the last received broadcasting station (so-called last station).

III. PTY Network Memory Access Processing

In the PTY network memory 19 illustrated in FIG. 1, respective data are stored with a corresponding relationship as shown in FIG. 8.

Referring specifically to FIG. 8, a PTY (Format) code data (indicative of "ROCK", "POPS", "NEWS", or the like) is stored in association with each station selection key information from first preset station selection key information (#1) to nth preset station selection information (#n). Also, except for station selection key information which is not set, at least one reception frequency data (i.e., reception frequency data on broadcast waves of a program type corresponded to associated station selection key information, for example, "F1", "F2", ..., "F10") is stored corresponding to each station selection key information. In this way, reception frequency information is classified according to the program type and stored in the classified state, thereby building a network for the respective program types.

According to the PTY network memory, when user manipulates the operation and display module 20, for example, to specify certain station selection key information, a PTY code corresponding to the specified station selection key information and reception frequency data to be set in the receiver circuit 12 can be read therefrom through the control circuit 16.

The PTY network memory 19 also stores identification data (hereinafter called the RBDS flag) R for identifying whether or not reception frequency data stored therein leads to a reception frequency for receiving RBDS broadcast waves. As a current grid recognized by the control circuit 16 changes, the contents of the reception frequency data and the RBDS flag are updated.

For the access control (update control) to the PTY network memory 19 having such storage modes, the following three examples may be provided.

(1) Example of the case where database supplementary data is present

This example will be described with reference to a flow chart of FIG. 9.

Figure 9:
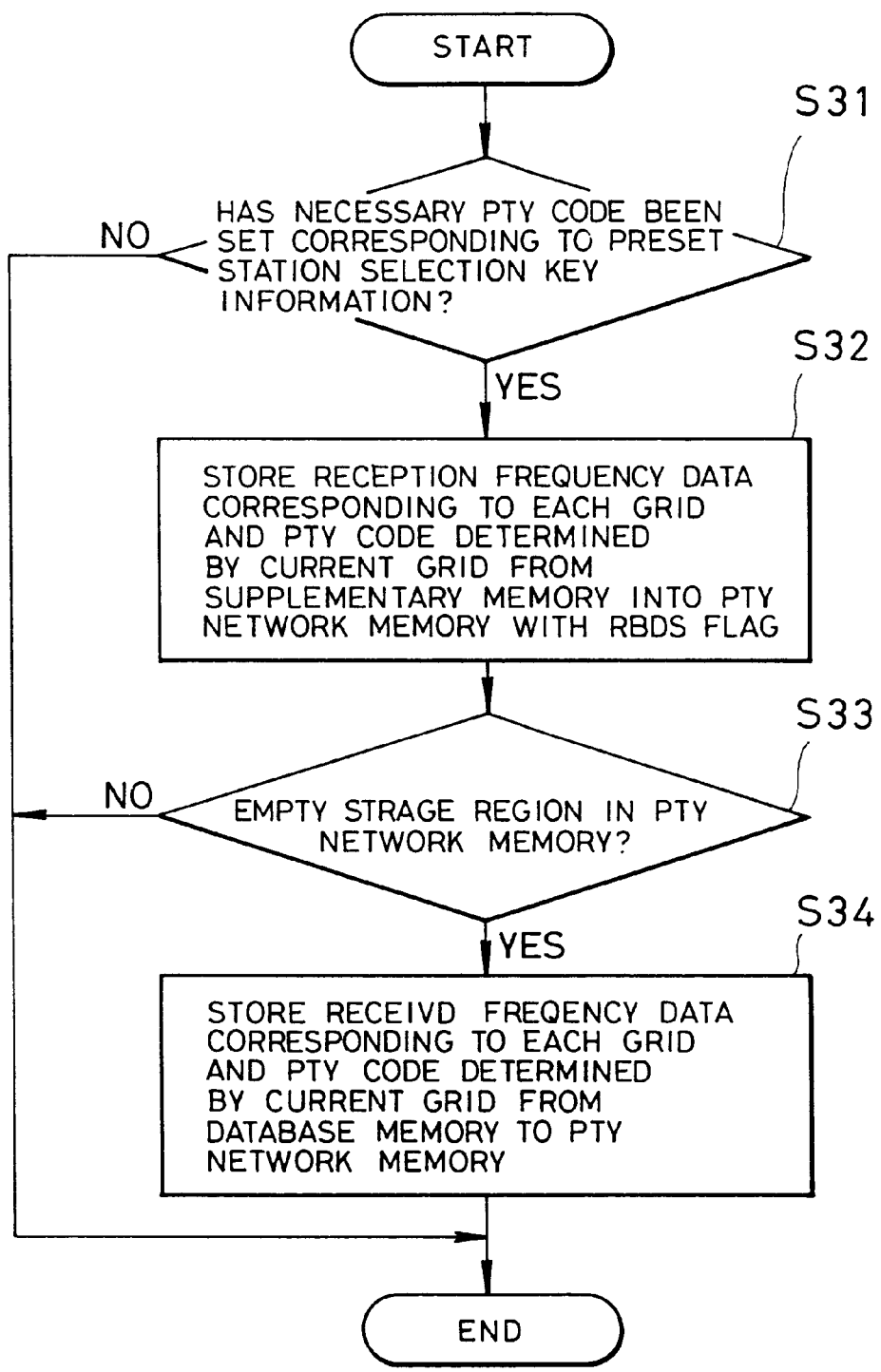
FIG. 9 is a flow chart representing PTY network memory access processing executed by the control circuit in the RBDS receiver of FIG. 1, and particularly showing an example where database supplementary data is present in received RBDS data.

Referring specifically to FIG. 9, when recognizing an update instruction to the PTY network memory 19 issued by the user through the operation and display module 20 or a change of a current grid (area), the control circuit 16 first determines whether or not a necessary PTY code is set in the station selection memory 19 in association with the station selection key information (step S31). If the control circuit 16 determines at step S31 that no necessary PTY code is set, the processing of this flow chart is terminated. Conversely, if the control circuit 16 determines at step S31 that a PTY code has been set in assosiation with the station selection key information, reception frequency data corresponding to the PTY code and also corresponding to a predetermined number of grid areas led by a current grid is read out from the database supplementary memory 18, and the read reception frequency data is stored into the PTY network memory 19 in correspondence to the associated PTY code and together with a set RBDS flag (step S32). Subsequently, it is determined whether or not the PTY network memory 19 has an empty storage region (step S33).

If determined at step S33 that there is no empty storage region in the PTY network memory 19, the processing of this flow chart is terminated. Conversely, if determined that the PTY network memory 19 has at least one empty storage region, reception frequency data corresponding to both of a predetermined number of grid areas led by the current grid code and the PTY code are read from the database memory 17, and the read reception frequency data are stored into the PTY network memory 19 in correspondence to the associated PTY code (step S34). It should be noted that in this case, the RBDS flag is not set.

(2) Example of the case where database supplementary data is not present

This example will be described with reference to a flow chart of FIG. 10.

Figure 10:
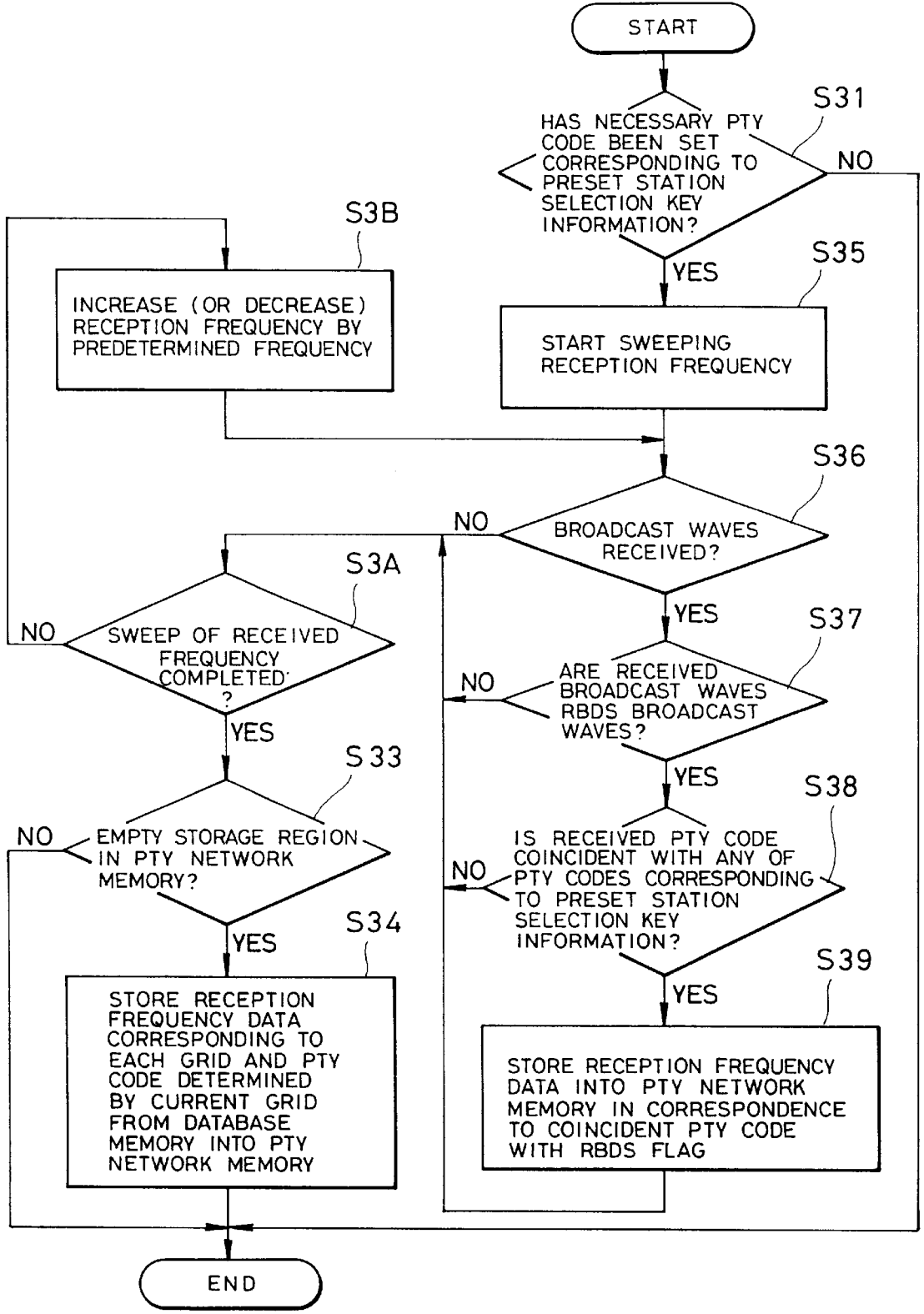
FIG. 10 is a flow chart representing the PTY network memory access processing executed by the control circuit in the RBDS receiver of FIG. 1, and particularly showing an example where database supplementary data is not present in received RBDS data.

Referring specifically to FIG. 10, where portions equivalent to those in FIG. 8 are designated the same reference numerals, the control circuit 16, if determining at step S31 that a necessary PTY code has been set corresponding to preset station selection key information, forces the receiver 22 to start sweeping reception frequency through the PLL circuit 21 (step S35). Then, similarly to the foregoing, it is determined whether or not broadcast waves are received at a reception frequency set at this time (step S36). If determined at step S36 that broadcast waves are received, it is also determined whether the received broadcast waves are RBDS broadcast waves (step S37).

If RBDS broadcast waves are confirmed at step S37, it is determined whether a PTY code included in RBDS data from the decoder 15 is coincident with any of respective PTY codes recognized at step S31 to be set corresponding to preset station selection key information (step S38). If determined coincidence at step S38, reception frequency data included in the RBDS data from the decoder 15 is stored into the PTY network memory 19 in correspondence to the coincident PTY code and together with the set RBDS flag (step S39).

If not determined coincidence at step S38, the flow proceeds to step S3A, determining that reception frequency data included in the RBDS data need not be written into the PTY network memory 19. Also, if determined at step S36 that no broadcast are received, if determined at step S37 that broadcast waves are not be received, or if the writing into the PTY network memory 19 has been completed at step S39, the flow proceeds to step S3A. It is determined at step S3A whether or not the receiver circuit 12 has completed the sweep of all settable reception frequency.

If the sweep of reception frequency has not been completed at step S3A, the receiver circuit 12 is forced to increase (or decrease) the set reception frequency by a predetermined amount (step S3B), and next the flow proceeds to step S36. Conversely, if the sweep of reception frequency has been completed at step S3A, it is determined whether or not the PTY network memory 19 has an empty storage region (step S33).

If determined at step S33 that PTY network memory 19 has no empty storage region, the processing of this flow chart is terminated. Conversely, if determined at step S33 that PTY network memory 19 has an empty storage region, reception frequency data corresponding to a predetermined number of grid areas led by a current grid code and to the PTY code is read from the database memory 17, and the read reception frequency data is stored into the PTY network memory 19 in correspondence to the associated PTY code (step S34). It should be noted that in this case the RBDS flag is not set.

(3) Example of PTY network memory access control in response to changed reception frequency and changed recieved PTY code This example will be described with reference to a flow chart of FIG. 11.

Figure 11:
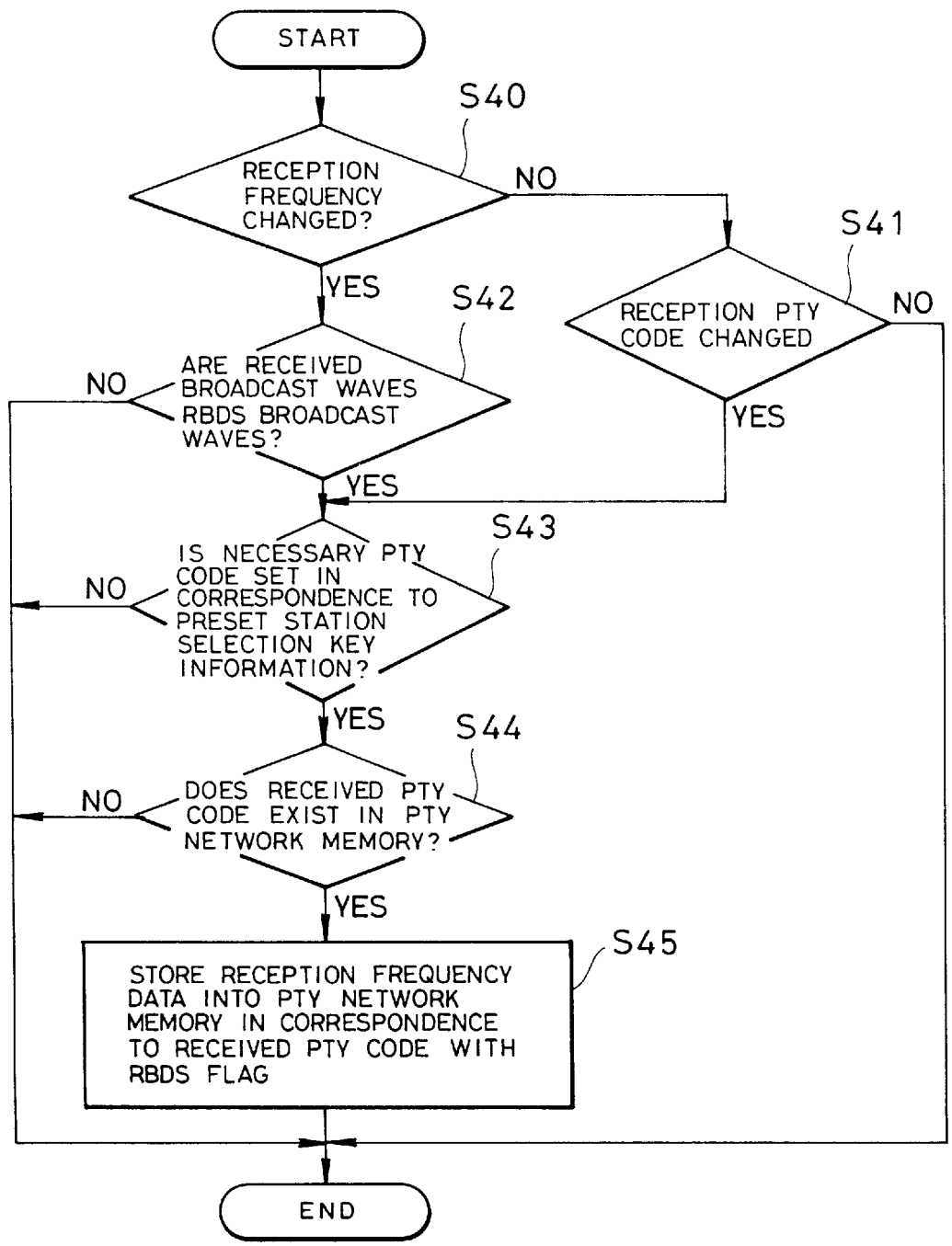
FIG. 11 is a flow chart representing the PTY network memory access processing executed by the control circuit in the RBDS receiver of FIG. 1, and particularly showing an example where the processing is executed in response to a changed reception frequency and to the reception of a received PTY code having different contents.

Referring specifically to FIG. 11, the control circuit 16 determines whether or not a reception frequency set in the receiver circuit 12 has been changed during receiving certain RBDS broadcast waves (step S40). If the reception frequency has not been changed, it is determined whether or not a received PTY code has been changed (step S41). If the reception frequency has been changed at step S40, it is determined whether or not received waves at the newly set reception frequency are RBDS broadcast waves (step S42). If determining at step S42 that RBDS broadcast waves are received, or at step S41 that the received PTY code has been changed, it is determined whether or not necessary PTY codes have been set or stored in the network memory 19 (step S43). If determined at step S43 that PTY codes are stored in the network memory 19 in correspondence to preset station selection key information, it is determined whether or not a PTY code fetched from RBDS data received at the reception frequency exists in the network memory 19 (step S44). If determined at step S44 that the received PTY code exists in the network memory 19, data on the reception frequency currently set in the receiver circuit 12 is stored in correspondence to the station selection key information of the PTY code, together with the set RBDS flag (step S45).

If no change in the received PTY code can be confirmed at step S41, if determined at step S42 that no RBDS broadcast waves have been received, if determined at step S43 that the PTY code is not set in association with the preset station selection key information, or if determined at step S44 that the received PTY code does not exist in the PTY network memory, the processing of this flow chart is immediately terminated.

According to the foregoing flows (1)–(3), RBDS data likely to include more recent information is stored into the PTY network memory 19 prior to storing data from the database. Such acquisition of RBDS data means that broadcast waves having the RBDS data have been received at least once. Therefore, to store the RBDS data preferentially into the PTY network memory 19 is advantageous in that broadcast waves will be received with higher possibility in the PTY search processing using data stored in the memory 19, as will be later described. In addition, since RBDS broadcast waves may be received in the PTY search processing with higher possibility, it is also advantageous in that not only audio information but also more additional information can be acquired from the RBDS broadcast waves to provide the user with more services.

It is often the case that the PTY code varies "dynamically" (described also in the foregoing) in RBDS broadcast waves emitted from a single RBDS station depending on the contents of broadcast programs (in this case, it follows the "YES" path from step S41). For example, the PTY code may vary to indicate a news program until one in the afternoon, and a rock program after that. In this event, as shown in FIG. 8, if a single RBDS station transmitting broadcast waves at a reception frequency F4 provides two of its programs, the reception frequency data is stored in correspondence to both the selections #1 and #n.

IV. PTY Search Processing

This processing will be described with reference to FIGS. 12 and 13.

Figure 12:
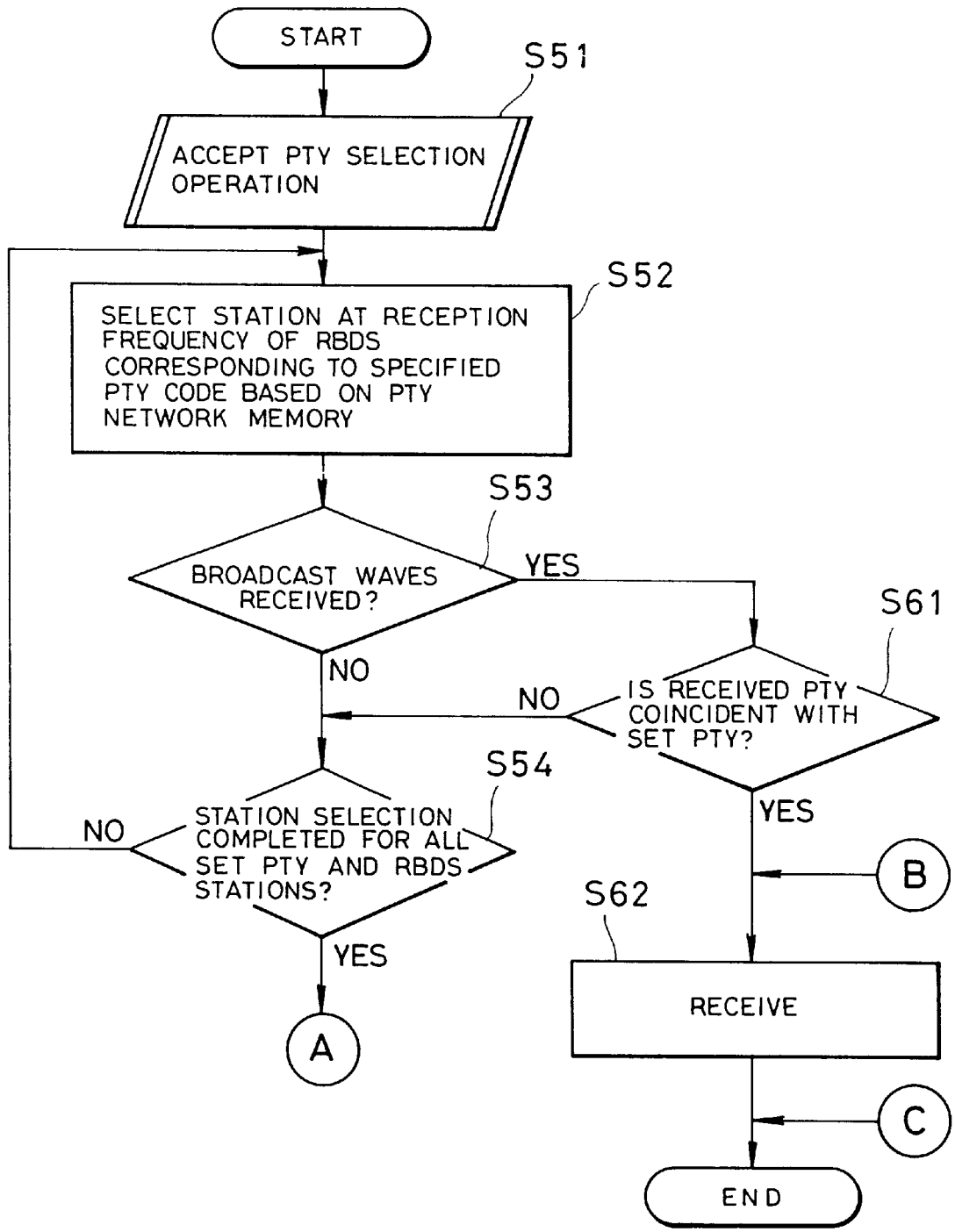
FIG. 12 is a flow chart representing the former half of PTY search processing executed by the control circuit in the RBDS receiver of FIG. 1.
Figure 13:
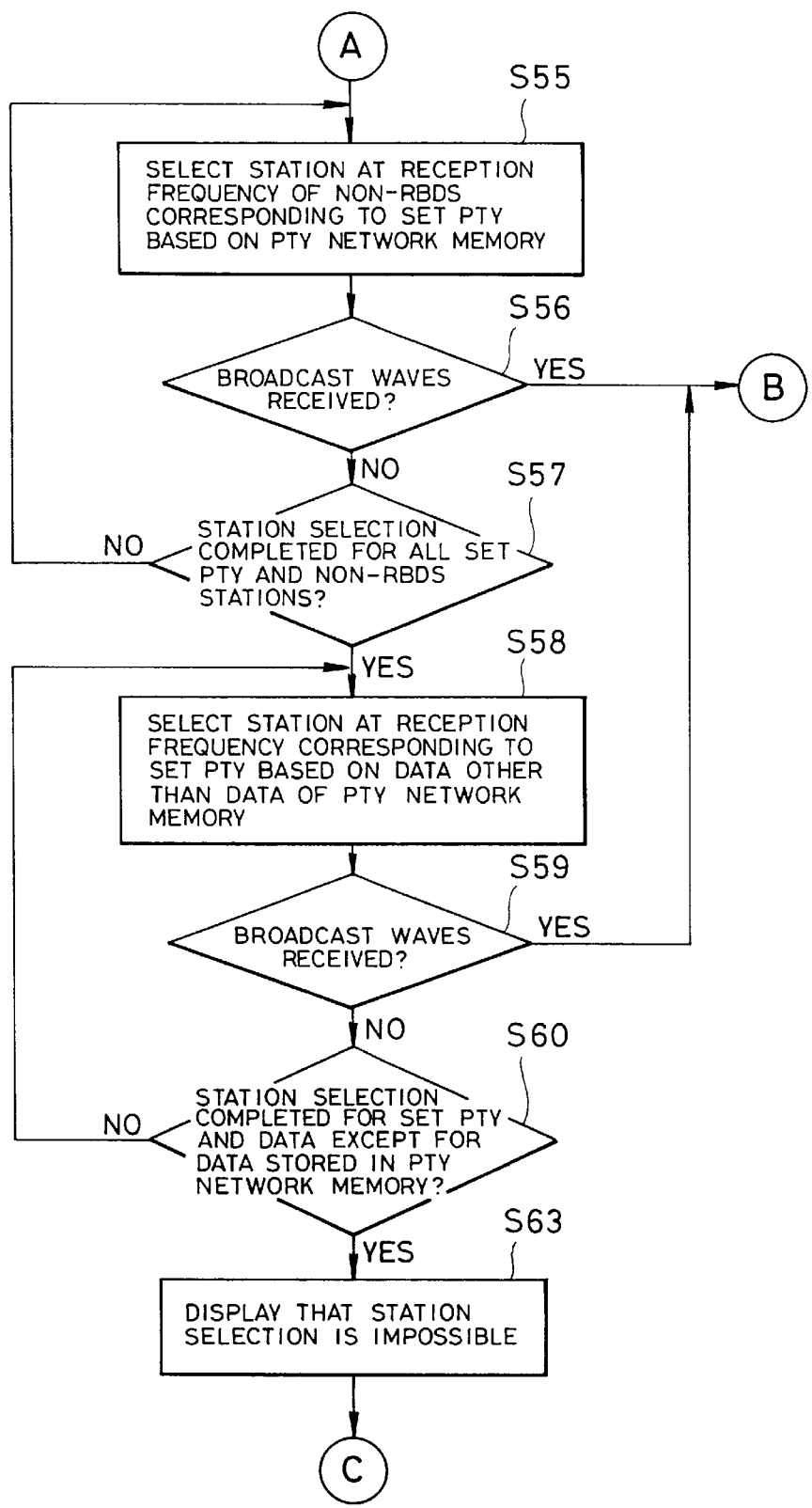
FIG. 13 is a flow chart representing the latter half of the PTY search processing executed by the control circuit in the RBDS receiver of FIG. 1.

Referring specifically to FIGS. 12 and 13, the control circuit 16 accepts a PTY selection operation by the user (step S51). For example, if the user selects "ROCK" as the program type (PTY), the control circuit 16 recognizes or sets a corresponding PTY code to indicate the reception of a broadcast program mainly providing rock music. Next, reception frequency data for receiving RBDS broadcast waves is read from reception frequency data corresponded to the set PTY code stored in the PTY network memory 19, and a reception frequency is set to the receiver circuit 12 based on the read reception frequency data to perform a station selection (step S52). The reading of the reception frequency data for the RBDS broadcast waves from the PTY network memory 19 is achieved by searching for the aforementioned RBDS flag and by reading reception frequency data which is stored in the PTY network memory 19 in correspondence to the set RBDS flag.

Subsequent to the station selection at step S52, it is determined whether the broadcast waves have been received (step S53). If not received, it is determined whether the station selection (search) of the set PTY code and RDBS station has been completed, relying on a determination as to whether all reception frequency data for the RBDS waves corresponding to the set PTY code have been used for the station selection at step S52 (step S54). If the completion of the search is not determined at step S54, the flow proceeds to step S52, where the station selection is performed based on the next reception frequency data on the RBDS broadcast waves corresponded to the set PTY code. If determined at step S53 that the broadcast waves have been received, it is determined whether a PTY code existing in RBDS data included in the received broadcast waves (received PTY code) is coincident with the PTY code set at step S51 (set PTY code) (step S61). If determined at step S61 that they are not coincident, the flow proceeds to step S54. Conversely, if determined that they are coincident, the reception frequency at the time the determination was made is fixed and the receiving operation is continued at that reception frequency (step S62).

According to the flow of steps S52–S54 and S61 as described above, the station selection is repeated for sequentially setting reception frequencies of RBDS broadcast waves corresponding to the set PTY code in the receiver circuit 12 on the basis of the stored data in the PTY network memory 19 until RBDS broadcast waves having the set PTY code are received, or until all reception frequencies of RBDS broadcast waves corresponding to the set PTY code have been attempted for the station selection. This repetitively executed flow is positioned as the first priority PTY search processing, in the flow chart of the entire search processing. In other words, the first priority PTY search processing performs a search for data on relatively new RBDS broadcasting stations in a single current grid area or in a plurality of grid areas including the current grid area and at least one grid area surrounding it, or a search for reception frequencies at which broadcast waves are relatively likely to be received and hence the received broadcast waves are highly likely to have the set PTY code.

If the termination of the first priority PTY search processing (station selection with reception frequencies of RBDS broadcast waves in the PTY network memory) is determined at step S54, the flow proceeds to the second priority PTY search processing.

More specifically, data on reception frequencies for receiving broadcast waves other than RBDS broadcast waves are read from among reception frequency data corresponded to the set PTY code stored in the PTY network memory 19, and reception frequency is set in the receiver circuit 12 based on the read reception frequency data for the station selection (step S55). This reading of the reception frequency data on non-RBDS broadcast waves from the PTY network memory 19 is achieved by searching the aforementioned RBDS flag and reading reception frequency data stored therein in correspondence to an RBDS flag being not in a set state.

Subsequent to the station selection at step S55, it is determined whether or not broadcast waves are received (step S56). If not received, it is determined whether or not the station selection (search) has been completed for the set PTY code and non-RBDS stations on the basis of a determination as to whether all reception frequency data for non-RBDS waves corresponded to the set PTY code have been used for the station selection at step S55 (step S57). If the completion of the search is not determined at step S57, the flow proceeds to step S55, where the station selection is performed based on next reception frequency data for non-RBDS broadcast waves corresponding to the set PTY code. If determined at step S56 that broadcast waves have been received, the reception frequency at the time of the determination is fixed for continuing the reception operation (step S62).

According to the flow of steps S55–S57 as described above, the station selection is repeated for sequentially setting in the receiver circuit 12 reception frequencies of non-RBDS broadcast waves corresponding to the set PTY code on the basis of the stored data in the PTY network memory 19, until non-RBDS broadcast waves corresponding to the set PTY code are received, or until all reception frequencies of non-RBDS broadcast waves corresponding to the set PTY code have been attempted for the station selection. This repetitively executed flow is provided on the assumption that, in response to a failure to receive RBDS broadcast waves having a set PTY code in the first priority PTY search processing, target broadcast waves are more likely to be received if reception frequencies are set so as to receive broadcast waves having the set PTY code over the entirety of a predetermined number of grid areas (thus, the entirety of the stored data in the PTY network memory 19) led by a currently set grid area, irrespective of whether broadcast waves are RBDS or not. Thus, this flow is positioned in the flow chart of the entire PTY search processing, as the second priority PTY search processing which extends the search range to non-RBDS broadcast waves in a single current grid area or in a plurality of grid areas including the current grid area and at least one grid area surrounding it.

If the second priority PTY search processing (station selection with reception frequencies of non-RBDS broadcast waves in the PTY network memory) is determined to be completed at step S57, the flow proceeds to the third priority PTY search processing.

More specifically, data on reception frequencies of broadcast waves having a program type indicated by a set PTY code are fetched from data stored other than in the PTY network memory 19, and a reception frequency is set to the receiver circuit 12 on the basis of the fetched reception frequency data for the station selection (step S58). In other words, reception frequency data corresponding to the set PTY code is read from among the stored data in the database memory 17 and/or the database supplementary memory 18 except for the stored data in the PTY network memory 19, and a reception (tuning) frequency is set in the receiver circuit 12 on the basis of the read reception frequency data for the station selection.

Subsequent to the station selection at step S58, it is determined whether or not broadcast waves have been received (step S59). If not received, it is determined whether or not the station selection (search) has been completed for the set PTY code and the integrated database, based on a determination as to whether or not all reception frequency data corresponding to the set PTY code in the stored data except for those stored in the PTY network memory 19 have been used for the station selection at step S58 (step S60). If the completion of the search is not determined at step S60, the flow proceeds to step S58, where the station selection is performed using the next reception frequency data corresponding to the set PTY code. If determined at step S59 that broadcast waves have been received, the reception frequency at the time of the determination is fixed for continuing the reception operation (step S62).

According to the flow of steps S58–S60 as described above, the station selection for sequentially setting reception frequencies of broadcast waves corresponding to a sep PTY code in the receiver circuit 12 is repeated based on the integrated database except for the stored data in the PTY network memory 19, i.e., based on reception frequency data which have not been stored in the memory 19 due to a limit of the capacity of the network memory 19 within reception frequency data corresponding to a predetermined number of grid areas led by a current grid area. This station selection continues until broadcast waves corresponding to the set PTY are received, or until all reception frequencies of broadcast waves corresponding to the set PTY have been attempted for the station selection. This repetitively executed flow is positioned in the flow chart of the entire PTY search processing, as the third priority PTY search processing which extends the search range to data not stored in the network memory 19 so as to set reception frequencies corresponding to the set PTY over the entirety of a predetermined number of grid areas led by the current grid area, in response to a failure to receive broadcast waves having the set PTY code in the first and second priority search processing, even on the basis of the data stored in the memory 19. Incidentally, the existence of data not stored in the network memory 19 is due to a limited number of storage areas for storing reception frequency data assigned to each station selection key information in the memory 19. When the number of reception frequency to be stored exceeds the limited number of storage areas, the reception frequency data are deleted at step S33.

If the completion of the third priority PTY search processing (station selection using reception frequencies based on data other than those stored in the PTY network memory 19) is determined at step S60, this means that any broadcast waves having a program type indicated by the set PTY code have not been found. Thus, it is determined that the station selection is impossible for the program type, and an anouncement, for example, "NO STATION" is displayed as a notification of the current situation (step S63). Such notification may be provided in the form of voice.

According to the foregoing PTY search processing, since three ranks of search processing, i.e., the first priority to the third priority, is performed in a stepwise manner, broadcast waves corresponding to a set PTY can be effectively received.

V. TP Mode and AFS Mode Setting

A TP mode refers to a mode which utilizes a TP (Traffic Program Identification) code to preferentially receive broadcast waves providing traffic information as well as to automatically proceed to the reception of other broadcast waves providing traffic information in accordance with possible deterioration in receiving environment and conditions. An AFS (Auto Format Scan) mode refers to a mode which likewise utilizes RBDS broadcast waves and/or previously described PTY (Format) codes included in data stored in the database memory 17 to preferentially receive broadcast waves of a program type set by the user or the like as well as to automatically proceed, in accordance with possible deterioration in received environment and conditions, to the reception of other broadcast waves of the same program type as that which was set prior to the deterioration. The present invention added several devises to the setting of these modes in the following matter.

The mode setting will be described with reference to flow charts of FIGS. 14 and 15.

Figure 14:
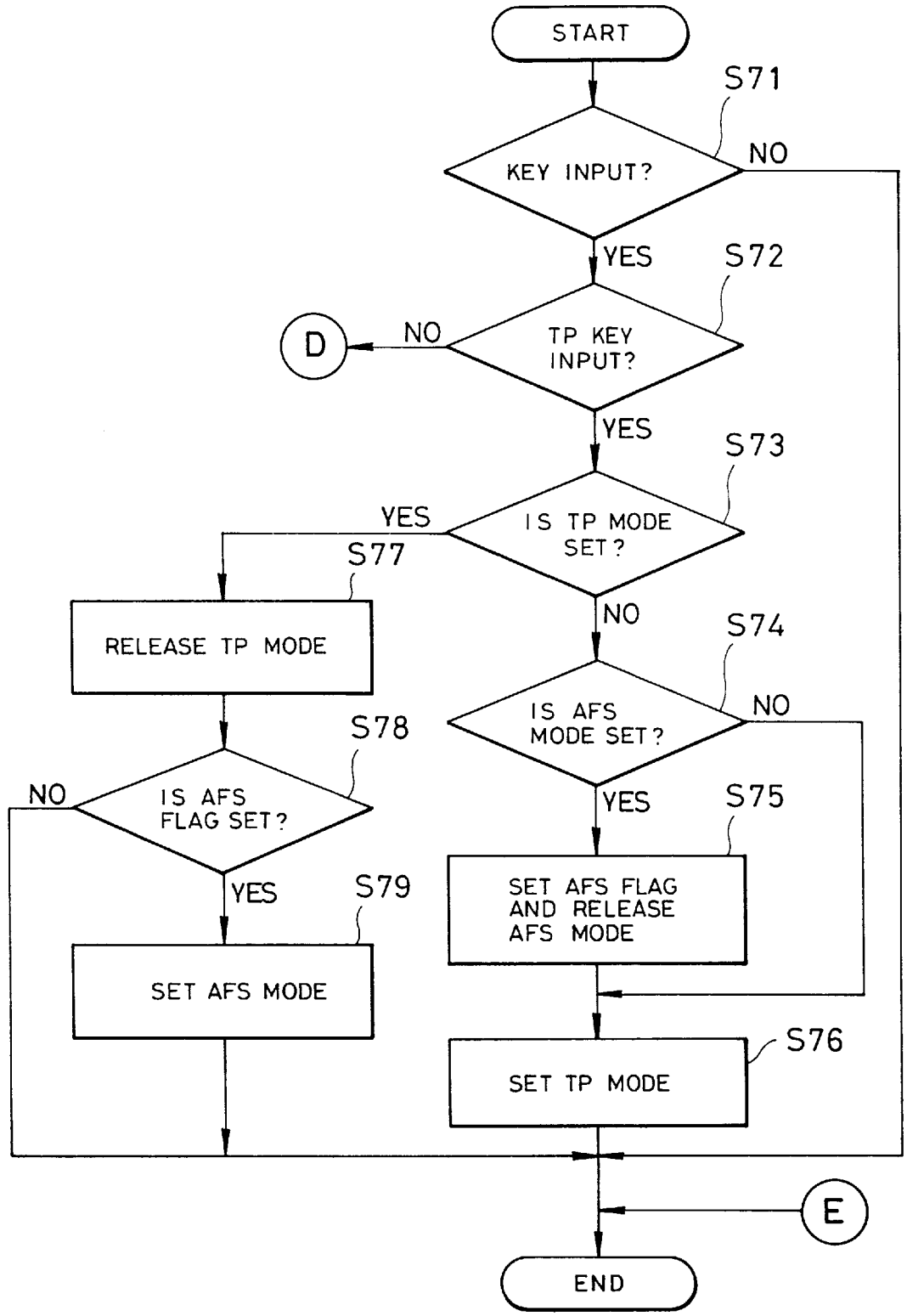
FIG. 14 is a flow chart representing the former half of TP mode and AFS mode setting processing executed by the control circuit in the RBDS receiver of FIG. 1.

Referring specifically to FIGS. 14 and 15, the control circuit 16 determines whether or not the user manipulates certain keys on the operation and display module 20 (step S71). If no key input is determined, the processing of this flow chart is terminated. Conversely, if any key input is found, it is determined whether or not the key input is made through a TP key for setting the TP mode (step S72). If determined at step S72 that the TP key is depressed, it is further determined whether or not the TP mode is set in the receiver or the control circuit 16 (step S73). If the TP mode is not set in the control circuit 16, it is determined whether or not the AFS mode is set in the control circuit 16 (step S74).

If determined at step S74 that the AFS mode is set in the control circuit 16, an AFS flag is set to release the AFS mode (step S75), and then the TP mode is set in the control circuit 16 (step S76). Conversely, if determined at step S74 that the AFS mode is not set, the flow immediately proceeds to step S76.

If determined at step S73 that the TP mode is set, the TP mode in the control circuit 16 is released (step S77).

Thereafter, the AFS flag is confirmed (step S78). If the AFS flag is set, the AFS mode is set in the control circuit 16 (step S79). Conversely, if the AFS flag is not set, the processing of this flow chart is terminated as it is.

If determined at step S72 that the TP key is not depressed, it is determined whether or not an AFS key is depressed for setting the AFS mode (step S80). If the AFS key is not depressed at step S80, the processing of this flow chart is terminated. Conversely, if the AFS key is depressed, it is determined whether or not the AFS mode is set in the control circuit 16 (step S81). If the AFS mode is not set at step S81, it is determined in the control circuit 16 whether or not the TP mode is set (step S82).

If determined at step S82 that the control circuit 16 is in the TP mode, the TP flag is set to release the TP mode (step S83), and then the AFS mode is set in the control circuit 16 (step S84). Conversely, if determined that the control circuit 16 is not in the TP mode, the flow immediately proceeds to step S84.

If determined at step S81 that the control circuit 16 is in the AFS mode, the AFS mode in the control circuit 16 is released (step S85). Subsequently, the TP flag is confirmed (step S86). If the TP flag is set, the TP mode is set in the control circuit 16 (step S87). Conversely, if not set, the processing of this flow chart is terminated as it is.

In the AFS mode, broadcast waves of a specified program type may be preferentially received using a PTY code included in the data stored in the PTY network memory and the supplementary memory.

In the foregoing description, the broadcast station related information has been limited to the PI (call sign), PTY (format), reception frequencies, TP and so on. However, it goes without saying that the present invention may be applied to other broadcasting station related information. In addition, while in the foregoing embodiments, the PTY network memory 19 and the database supplementary memory 18 have been described as separate memories, they may be composed of one and the same memory.

Of course, the present invention is not limited to the configuration implemented entirely by hardware, and may be partially implemented by software, or may be a combination of both.

As described above in detail, according to an RBDS receiver of a first aspect of the present invention, received RBDS data is compared with broadcasting station related data in a database memory and stored data in a database supplementary memory, the RBDS data is written into the supplementary memory if a broadcasting station indicated by the received RBDS data is not coincident with any of broadcasting stations indicated by the broadcasting station related data and the data stored in the supplementary memory. In this way, the database can be supplemented rapidly and correctly in response to updates in the contents of actually broadcast programs, and control can be properly made for display or the like in accordance with the contents of the actually broadcast programs.

Additionally, according to an RBDS receiver of a second aspect of the present invention, in a station selection memory for storing identification data indicating a program type and at least one received frequency data for broadcast waves providing the program type, RBDS identification data indicating whether or not broadcast waves received based on the reception frequency data are RBDS broadcast waves is stored for each of reception frequency data stored therein. This promotes the reception of the RBDS broadcast waves in a mode for receiving broadcast waves of a desired program type by the use of the station selection memory (PTY search), thereby making it possible to receive broadcast waves and to increase opportunities of utilizing RBDS data for a variety of control.

Further, according to an RBDS receiver of a third aspect of the present invention, a traffic information receiving mode for preferentially receiving RBDS broadcast waves providing traffic information based on traffic information program identification data included in RBDS data is prohibited from being set simultaneously with a set program receiving mode for preferentially receiving broadcast waves of a set program type based on RBDS data and/or identification data on the program type included in stored data in the database memory, thus making it possible to select a smooth operation form in the reception control as well as to provide the user with broadcasting information of a unified form.

What is claimed is:

1. An RBDS receiver provided with a database having broadcasting station related information, comprising:

read-only database memory in which a broadcasting station related data has been previously stored respectively in association with geographical positional information, the broadcasting station related data having at least three kinds of data including a station identification data for identifying a broadcasting station, a program identification data for indicating the type of a program provided by the broadcasting station, and reception frequency data on broadcast waves emitted from the broadcasting station;

demodulating means for demodulating an RBDS data from received broadcast waves;

a randomly accessible database supplementary memory;

station selection memory for storing an indication of whether received broadcast waves are RBDS broadcast waves; and control means for comparing the contents of said RBDS data with the contents of said broadcasting station related data and the data stored in said supplementary memory and for controlling the writing of said RBDS data into said supplementary memory if a broadcasting station indicated by said RBDS data is not coincident with any of broadcasting stations indicated by said broadcasting station related data and the data stored in said supplementary data.

2. An RBDS receiver according to claim 1, further comprising display means for providing a display based on said RBDS data in synchronism with the write control to said supplementary memory performed by said control means.

3. An RBDS receiver according to claim 1, wherein said demodulating means includes a receiver circuit for tuning to received broadcast waves at a set reception frequency, wherein said control means forces said receiver circuit to sweep the reception frequency, and compares information contents between an RBDS data demodulated from the received broadcast waves and said broadcasting station related data and the data stored in said supplementary memory in the sweep, so as to control the writing of said RBDS data into said supplementary memory if the broadcasting station indicated by said RBDS data is not coincident with any of broadcasting stations indicated by said broadcasting station related data and the data stored in said supplementary data.

4. An RBDS receiver according to claim 1, wherein said control means compares information contents between said RBDS data and said broadcasted station related data and the data stored in said supplementary memory so as to also control the writing of said RBDS data into said supplementary memory, if the broadcasting station indicated by said RBDS data is coincident with one of broadcasting stations indicated by said broadcasting station related data and the data stored in said supplementary memory and if a program type indicated by said RBDS data is not coincident with any of program types indicated by said broadcasting station related data and the data stored in said supplementary memory corresponding to the coincident broadcasting station.

5. An RBDS receiver provided with a database having broadcasting station related information, comprising:

a read-only database memory in which a broadcasting station related data has been previously stored respectively in association with geographical positional information, the broadcasting station related data having at least three kinds of data including a station identification data for identifying a broadcasting station, a program identification data for indicating the type of a program provided by the broadcasting station, and reception frequency data on broadcast waves emitted from the broadcasting station;

demodulating means for demodulating an RBDS data from received broadcast waves; and station selection memory for storing identification data for identifying a single program type and at least one reception frequency data of broadcast waves providing the program type for each station selection key information;

wherein said station selection memory includes a designation of whether the broadcast waves received at the associated reception frequency data are RBDS broadcast waves, for each of the reception frequency data stored in said station selection memory.

6. An RBDS receiver according to claim 5, wherein said station selection memory in which a reception frequency data is stored in association with a transmission station which exists in a geographical region led by a currently receiving position or a transmission station which emits broadcast waves receivable in said geographical region.

7. An RBDS receiver according to claim 6, further comprising control means for performing first write control for writing a reception frequency data included in said RBDS data having identification data for identifying a program type stored in said station selection memory into said station selection memory in correspondence with the program type together with said RBDS identification data, and second write control for writing reception frequency data associated with said geographical region and corresponding to a program type stored in said station selection memory within the data stored in said database memory into said station selection memory in correspondence to the program type.

8. An RBDS receiver according to claim 7, further comprising:

a randomly accessible database supplementary memory; and control means for comparing the contents of said RBDS data with the contents of said broadcasting station related data and the data stored in said supplementary memory to perform control for writing said RBDS data into said supplementary memory in correspondence to data on the currently receiving position, if a broadcasting station indicated by said RBDS data is not coincident with any of broadcasting stations indicated by said broadcasting station related data and the data stored in said supplementary memory, wherein said first write control having control for writing a reception frequency data into said station selection memory together with said RBDS identification data in correspondence to the program type, the reception frequency data corresponding to said geographical region and to a program type stored in said station selection memory and being fetched from the data stored in said supplementary memory.

9. An RBDS receiver according to claim 7, wherein:

said demodulator means includes a receiver circuit for tuning to received broadcast waves at a set reception frequency; and said control means performs first search control for reading a reception frequency data on RBDS broadcast waves having a specified program type from said station selection memory to force said receiver circuit to tune based on the read reception frequency data, and performs second search control, if said receiver fails to receive broadcast waves of the specified program type as a result of the tuning, for a reading reception frequency data on non-RBDS broadcast waves having the specified program type from said station selection memory to force said receiver circuit to tune based on the read reception frequency data.

* * * * *

UNITED STATES PATENT AND TRADEMARK OFFICE
CERTIFICATE OF CORRECTION

PATENT NO. : 5,898,910
DATED : April 27, 1999
INVENTOR(S) : Takashi MIYAKE et al.

It is certified that error appears in the above-identified patent and that said Letters Patent is hereby corrected as shown below:

Title Page, Item [57], in the Abstract, line 7, "receptiond" should read --reception--.

Signed and Sealed this

Sixth Day of June, 2000

Attest:

Attesting Officer

Q. TODD DICKINSON
Director of Patents and Trademarks